United States Patent
Mukohara (10) Patent No.: US 11,589,489 B2
(45) Date of Patent: Feb. 21, 2023

(54) LEAD WIRE STRAIGHTENING DEVICE

(71) Applicant: FUJI CORPORATION, Chiryu (JP)

(72) Inventor: Takaji Mukohara, Toyota (JP)

(73) Assignee: FUJI CORPORATION, Chiryu (JP)

( * ) Notice: Subject to any disclaimer, the term of this patent is extended or adjusted under 35 U.S.C. 154(b) by 680 days.

(21) Appl. No.: 16/604,289

(22) PCT Filed: Apr. 27, 2017

(86) PCT No.: PCT/JP2017/016790
§ 371 (c)(1),
(2) Date: Oct. 10, 2019

(87) PCT Pub. No.: WO2018/198279
PCT Pub. Date: Nov. 1, 2018

(65) Prior Publication Data
US 2020/0053921 A1 Feb. 13, 2020

(51) Int. Cl.
*H05K 13/02* (2006.01)
*H05K 13/08* (2006.01)
*B21F 1/02* (2006.01)

(52) U.S. Cl.
CPC ............ *H05K 13/026* (2013.01); *B21F 1/02* (2013.01); *H05K 13/0812* (2018.08); *H05K 13/0882* (2018.08)

(58) Field of Classification Search
CPC ..... B21F 1/02; H05R 13/026; H05R 13/0812; H05R 13/0882
See application file for complete search history.

(56) References Cited

U.S. PATENT DOCUMENTS

2018/0303016 A1* 10/2018 Iwata ................. H05K 13/0473

FOREIGN PATENT DOCUMENTS

| JP | 62-220233 A | | 9/1987 |
| JP | 02-12399 A | * | 5/1990 |
| JP | 2010-075957 A | * | 4/2010 |

OTHER PUBLICATIONS

International Search Report dated Jul. 18, 2017 in PCT/JP2017/016790 filed on Apr. 27, 2017.

* cited by examiner

*Primary Examiner* — Carl J Arbes
(74) *Attorney, Agent, or Firm* — Oblon, McClelland, Maier & Neustadt, L.L.P.

(57) ABSTRACT

A lead wire straightening device including a control device that disposes a lead wire of a lead component that is held by a holding section between a first claw section and a second claw section. The control device causes an opening/closing driving section of a straightening unit to clamp and straighten the lead wire by the first and second claw sections. After the lead wire is clamped, the control device causes a driving section to rotate at least one of the holding section and the straightening unit to thereby change positions of the first and second claw sections relative to the lead wire. Then, after changing the positions of the first and second claw sections relative to the lead wire, the control device causes the first and second claw sections to clamp the lead wire again to straighten the lead wire.

6 Claims, 10 Drawing Sheets

LEAD WIRE STRAIGHTENING DEVICE

TECHNICAL FIELD

The present application relates to a lead wire straightening device for straightening the bending of a lead wire of a lead component.

BACKGROUND ART

Conventionally, there are lead wire straightening devices (for example, Patent Literature 1) for straightening the bending of a lead wire of a lead component. A lead wire straightening device described in Patent literature 1 straightens the bending of a lead itself or a positional relationship between a main body section of a lead component and a lead. Specifically, the lead wire straightening device includes a lead wire clamper and an advancing/retreating cylinder for the lead wire clamper. The lead wire clamper includes a pair of straightening claws and clamps a lead wire with the pair of straightening claws. The lead wire clamper advancing and retreating cylinder advances and retreats the lead wire clamper along an insertion direction of the lead wire.

In the straightening work, a lead component clamped at a main body section by insertion fingers is rested on a fixing plate. The lead component is rested on the fixing plate at the main body section and lead wires of the lead component are inserted into through holes of the fixing plate. The lead wire straightening device drives the lead wire clamper and the advancing/retreating cylinder thereof to lift up the lead wire clamper, so that the lead wire is inserted between the pair of straightening claws. The lead wire clamper clamps the lead wire by the pair of straightening claws. In the lead wire straightening device, the lead wire clamper is lowered (retreated) by the lead wire clamper advancing and retreating cylinder while causing the pair of straightening claws to keep clamping the lead wire. For example, when the lead wire bends, the bending of the lead wire is straightened as the lead wire clamper lowers, and the lead wire is removed from the pair of straightening claws.

PATENT LITERATURE

Patent Literature 1: JP-A-62-220233

BRIEF SUMMARY

Technical Problem

In the lead wire straightening device described above, the lead wire clamper is advanced and retreated in an up-down direction by the lead wire clamper advancing and retreating cylinder. In this configuration, when it is desired to straighten the lead wire up to a proximal end section on a side thereof that faces the main body section, the straightening claws (the lead wired clamper) need to be lowered further downwards than a distal end portion of the lead wire with the proximal end section of the lead wire clamped by the straightening claws. Due to this, in the lead wire straightening device described above, there is a need for ensuring a space for enabling the lead wire clamper to move upwards and downwards in accordance with a length of the lead wire, which may turn out the lead wire straightening device being larger in size.

The present disclosure has been made in view of the problem described above, and an object thereof is to provide a lead wire straightening device which can realize a reduction in size thereof.

Solution to Problem

With a view to solving the problem, according to the present disclosure, there is disclosed a lead wire straightening device comprising: a holding section configured to hold a lead component; a straightening unit configured to straighten a lead wire that the lead component includes; a driving section configured to rotate at least one of the holding section and the straightening unit around a rotation axis extending in a first direction, the holding section and the straightening unit facing each other along the direction of which when straightening the lead wire; and a control device, wherein the straightening unit further comprises: a first claw section; a second claw section disposed in a position facing the first claw section in a second direction intersecting the first direction; and an opening/closing driving section configured to move the first claw section towards or away from the second claw section, and wherein the control device performs: a process of disposing the lead wire of the lead component held by the holding section between the first claw section and the second claw section; a process of straightening the lead wire by controlling the opening/closing driving section of the straightening unit such that the first claw section and the second claw section clamps the lead wire therebetween; a process of changing positions of the first claw section and the second claw section relatively to the lead wire by controlling the driving section, after the lead wire is clamped, such that at least one of the holding section and the straightening unit rotate; and a process of clamping again the lead wire with the first claw section and the second claw section to thereby straighten the lead wire after the positions of the first claw section and the second claw section are changed.

Advantageous Effects

According to the lead wire straightening device, the control device controls the driving section and causes at least one of the holding section and the straightening unit to rotate around the rotation axis extending in the first direction. The control device changes the positions of the first claw section and the second claw section relative to the lead wire by rotating the holding section or the like after the lead wire is clamped to be straightened once by the first and second claw sections. Then, the control device causes the lead wire to be clamped again and performs the straightening of the lead wire after the positions of the first and second claw sections relative to the lead wire are changed. As a result, the bending of the lead wire, the deviation in positional relationship between a main body section of the lead component and the lead wire or the like can be straightened by changing the relative positions (the rotational positions) of the first and second claw sections relative to the lead wire to thereby clamp the lead wire from different directions. Thus, with this configuration, being different from the configuration according to the related art, the straightening unit does not have to be advanced towards and retreated from the lead component. As a result, the lead wire straightening device can be miniaturized accordingly.

DESCRIPTION OF EMBODIMENTS

Hereinafter, an embodiment in which a lead wire straightening device of the present patent application is embodied into a component mounter will be described in detail by reference to drawings.

(Configuration of Component Mounter)

Figure 1:
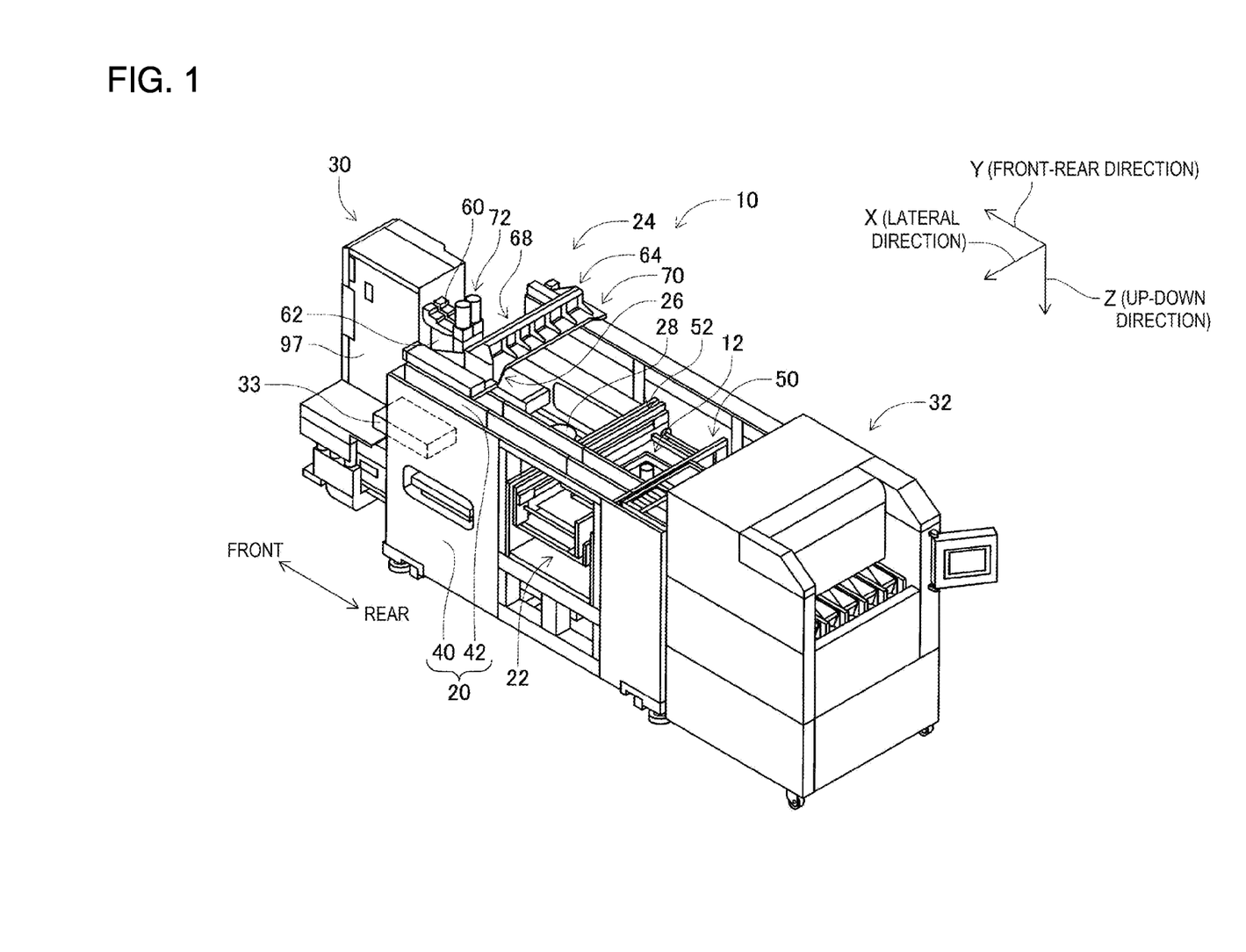
FIG. 1 is a perspective view showing a component mounter of the present embodiment.

FIG. 1 shows component mounter 10. Component mounter 10 is a device for mounting components on circuit substrate 12. Component mounter 10 includes device main body 20, substrate conveyance and holding device 22, component mounting device 24, mark camera 26, part camera 28, component supply device 30, bulk component supply device 32, straightening unit 33, and control device 34 (refer to FIG. 8). Incidentally, a circuit board, a substrate having a three-dimensional structure and the like are exemplified as circuit substrate 12, and a printed wiring board, a printed circuit board and the like are exemplified as the circuit board.

Device main body 20 includes frame section 40 and beam section 42 mounted over frame section 40. Substrate conveyance and holding device 22 is disposed at a center of frame section 40 in a front-rear direction, and includes conveyance device 50 and clamping device 52. Conveyance device 50 is a device for conveying circuit substrate 12. Clamping device 52 is a device for holding circuit substrate 12. As a result, substrate conveyance and holding device 22 conveys circuit substrate 12 and fixedly holds circuit substrate 12 in a predetermined position. In the following description, a conveyance direction of circuit substrate 12 is referred to as an X-direction (lateral direction), a horizontal direction perpendicular to the X-direction is referred to as a Y-direction (a front-rear direction), and a vertical direction is referred to as a Z-direction (an up-down direction). That is, the X-direction constitutes a width direction of component mounter 10, and the Y-direction constitutes the front-rear direction of component mounter 10.

Figure 2:
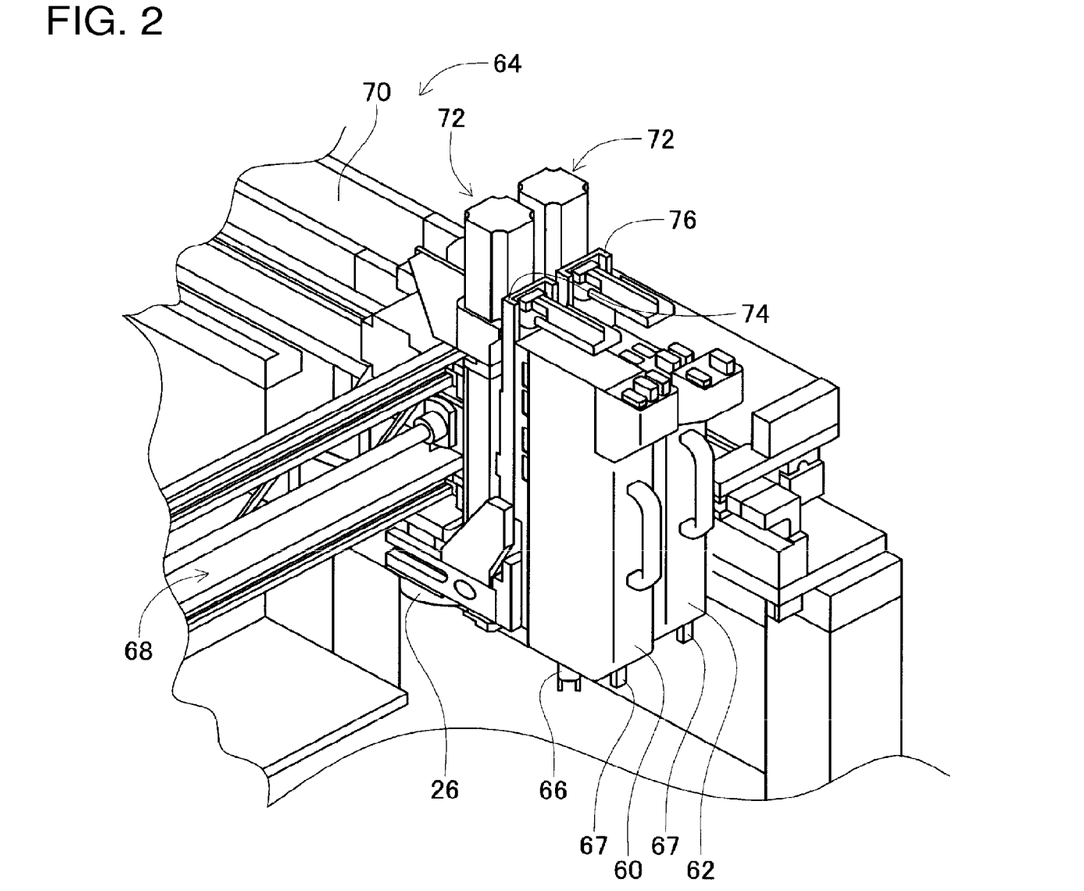
FIG. 2 is a perspective view showing a component mounting device of the component mounter.
Figure 8:
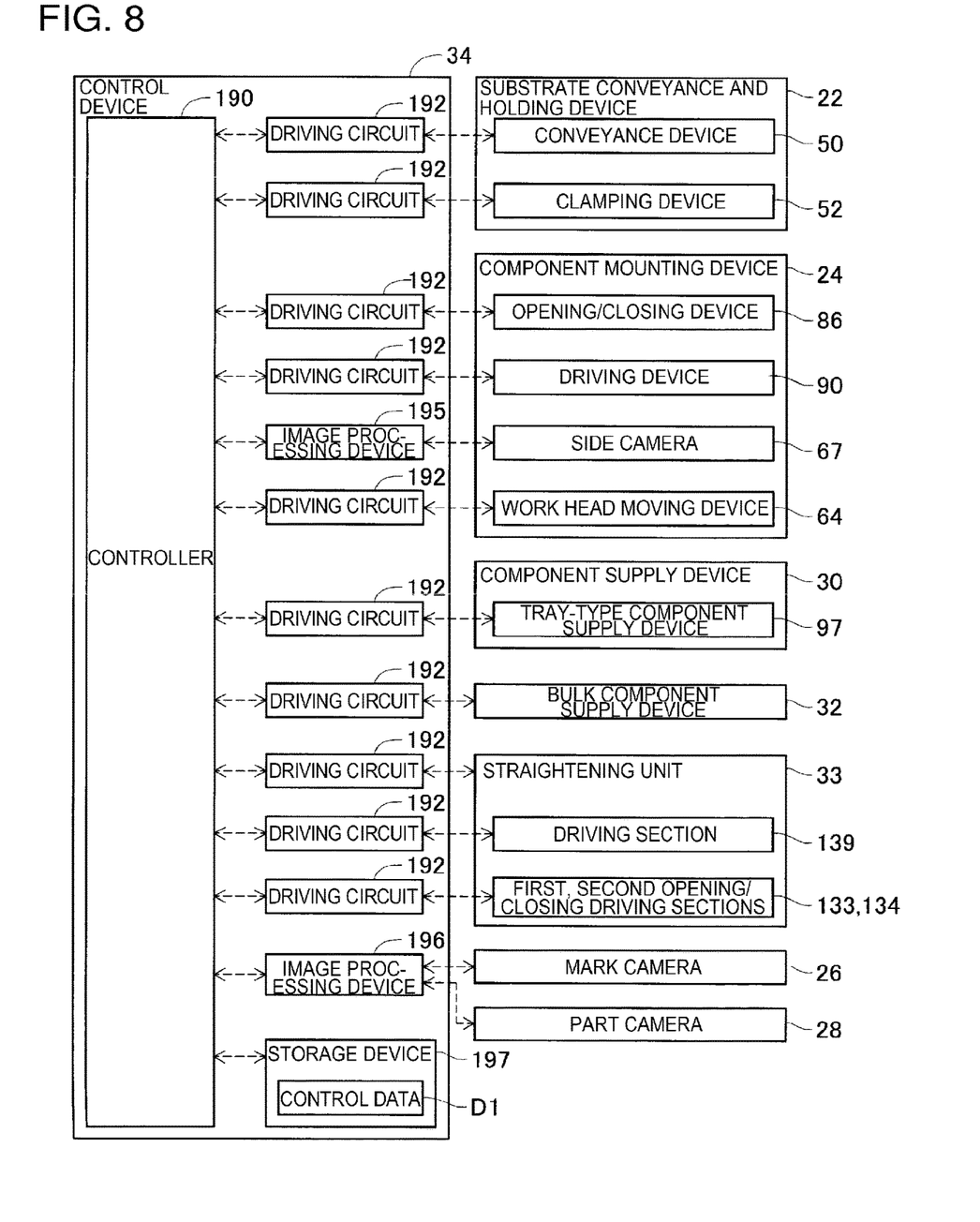
FIG. 8 is a block diagram showing a control device of the component mounter.

Component mounting device 24 is disposed on beam section 42, and includes two work heads 60, 62, work head moving device 64, opening/closing device 86 (refer to FIG. 8), and driving device 90 (see FIG. 8). Work heads 60, 62 each have chuck 66 (refer to FIGS. 2, 3) and hold a component with chuck 66. Work head moving device 64 includes X-direction moving device 68, Y-direction moving device 70, and Z-direction moving device 72. Then, two work heads 60, 62 are moved together to any position on frame section 40 by X-direction moving device 68 and Y-direction moving device 70. As shown in FIG. 2, work heads 60, 62 are detachably mounted on sliders 74, 76, respectively. Z-direction moving device 72 moves sliders 74, 76 individually in the up-down direction. That is, work heads 60, 62 are individually moved in the up-down direction by Z-direction moving device 72.

Figure 3:
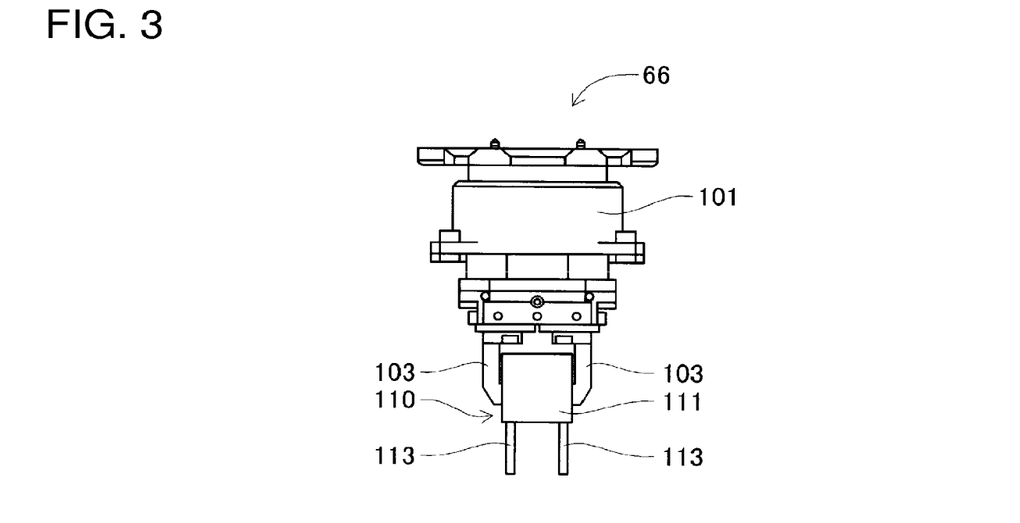
FIG. 3 is a chuck mounted on a work head.

As shown in FIG. 3, chuck 66 includes main body section 101 and pair of chuck claws 103. Pair of chuck claws 103 are disposed to extend downwards from a lower surface of main body section 101 and are configured to move towards and away from each other as opening/closing device 86 operates. As a result, chuck 66 clamps a component, for example, component main body section 111 of lead component 110 with pair of chuck claws 103 as shown in FIG. 3 by causing pair of chuck claws 103 to move towards each other. In addition, chuck 66 causes lead component 110 to be released from between pair of chuck claws 103 by causing pair of chuck claws 103 to move away from each other. Chuck 66 is detachably mounted at a lower end portion of each of work heads 60, 62. A device for holding lead component 110 is not limited to chuck 66. For example, each of work heads 60, 62 may include a suction nozzle for holding a component through suction as a device for holding lead component 110. Further, work heads 60, 62 may each include claws for clamping lead wire 113 therebetween in place of component main body section 111.

Figure 4:
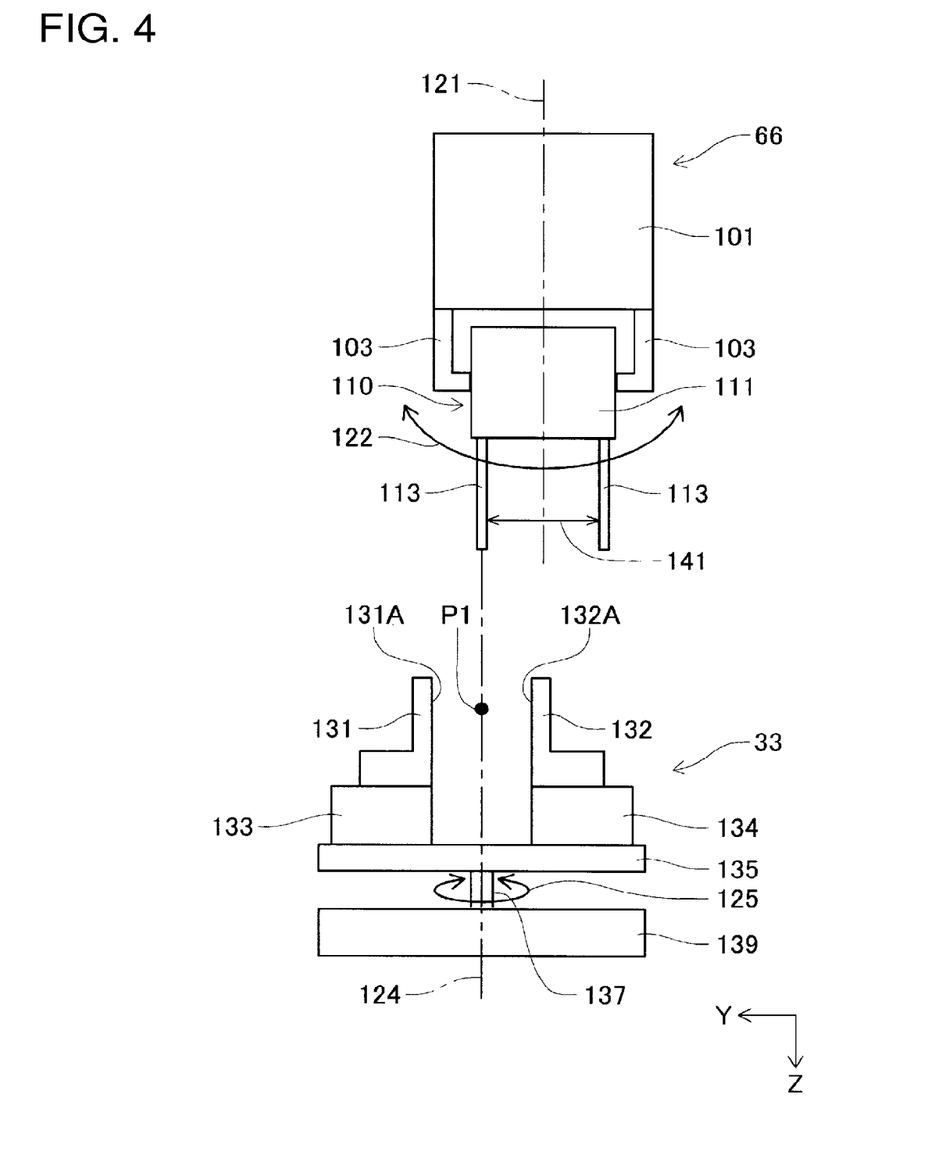
FIG. 4 is a schematic diagram showing an arrangement of a lead component held by the chuck and a straightening unit when clamping the lead component with the straightening unit.

Work heads 60, 62 can move corresponding chucks 66 in the Z-direction (the up-down direction) by driving device 90 (refer to FIG. 8). Work heads 60, 62 can drive driving device to thereby rotate corresponding chucks 66. FIG. 4 schematically shows an arrangement of lead component 110 held by chuck 66 and straightening unit 33 when clamping lead component 110 with straightening unit 33. FIG. 4 illustrates a state of lead wire 113 that is not bent, that is, lead wire 113 needing no straightening or lead wire 113 that has been already straightened.

Driving device 90 includes, for example, electromagnetic motor as a driving source. Driving device 90 rotates chuck 66 (an example of a holding section) around rotation axis 121 extending along the up-down direction (a first direction) constituting a direction in which chuck 66 (work heads 60, 62) and straightening unit 33 face each other when straightening lead wire 113 as shown in FIG. 4 (refer to arrow 122 in FIG. 4). Rotation axis 121 constitutes an axis extending along the up-down direction and passing through, for example, a center of component main body 111 of lead component 110 (a center of gravity of lead component 110). As a result, a position of straightening unit 33 (first and second claw sections 131, 132) relative to lead wire 113 held by chuck 66 is changed. Rotation axis 121 around which chuck 66 rotates is not limited to the direction extending along the up-down direction (the first direction) but may be an axis extending along a direction that forms a predetermined angle with the up-down direction.

As shown in FIG. 2, side camera 67 for imaging a component held by chuck 66 is attached to each of work heads 60, 62. Side camera 67 can image, for example, the whole of lead component 110 from a side thereof, with component main body section 111 clamped by chuck 66.

As shown in FIG. 2, mark camera 26 is attached to slider 74 while being directed downwards and is moved together with work head 60 in the X-direction, the Y-direction, and the Z-direction. As a result, mark camera 26 can image any position on frame section 40 and can image a mark or the like of circuit substrate 12. As shown in FIG. 1, part camera 28 is disposed between substrate conveyance and holding device 22 and component supply device 30 on frame section 40 while being directed upwards, that is, with its imaging direction set to be directed upwards. As a result, part camera 28 can image a component (lead component 110 or the like) held by chuck 66 of each of work heads 60, 62.

As shown in FIG. 1, component supply device 30 is disposed at a first end portion of a first side (a front side) of frame section 40 in the front-rear direction. Component supply device includes tray-type component supply device 97 and a feeder-type component supply device (not shown). Tray-type component supply device 97 is a device for supplying a component (such as lead component 110) placed on a tray. The feeder-type component supply device is a device for supplying components by a tape feeder (not shown) and a stick feeder (not shown).

Bulk component supply device 32 is disposed at an end portion on a second side (a rear side) of frame section 40 in the Y-direction (the front-rear direction). Bulk component supply device 32 is a device for supplying multiple components (such as lead components 110) in an aligned state by aligning the multiple components that are scattered at random. That is, bulk component supply device 32 is a device for supplying multiple components oriented differently in a predetermined state by aligning them into a predetermined orientation.

Electronic circuit components, constituent components of a solar cell, constituent components of a power module, and the like are raised as components that are supplied by component supply device 30 and bulk component supply device 32. Electronic circuit components include lead components 110 having a lead wire (radial components or axial components), components having no lead wire, and the like.

As with component supply device 30, straightening unit 33 is disposed at the end portion of the first side (the front side) of frame section 40 in the Y-direction (the front-rear direction). Straightening unit 33 can detachably be attached to component mounter 10. For example, straightening unit 33 can detachably be attached to a slot of component mounter 10 having a feeder-type component supply device mounted thereon and is driven by receiving electric power supplied from a power supply of component mounter 10.

Figure 5:
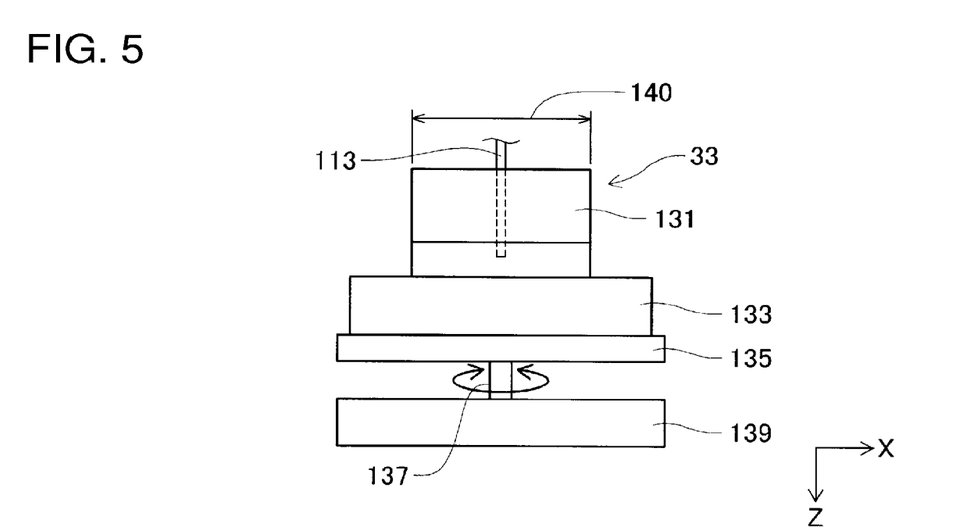
FIG. 5 is a diagram showing a state in which the straightening unit is seen from a first claw section's side.

As shown in FIG. 4, straightening unit 33 includes first claw section 131, second claw section 132, first opening/closing driving section 133, second opening/closing driving section 134, base 135, support shaft 137, and driving section 139. FIG. 5 shows a state where straightening unit 33 is seen from a side of first claw section 131. FIGS. 4 and 5 show an initial state of straightening unit 33. For example, in the initial state of the straightening unit 33 where straightening unit 33 is mounted in a slot on component mounter 10, first and second claw sections 131, 132 are disposed to face each other in the Y-direction (the front-rear direction). In this case, second claw section 132 is disposed in a position where second claw section 132 faces first claw section 131 in the front-rear direction (a second direction) that intersects the up-down direction (the first direction) (in this embodiment, a direction that intersects the up-down direction at right angles). First and second claw sections 131, 132 may be caused to face each other in a direction that forms a predetermined angle with the front-rear direction that intersects the up-down direction at right angles. In the following description, the configuration of straightening unit 33 will be described based on the initial state described above. Second claw section 132 has the same configuration as that of first claw section 131. Therefore, in the following description, first claw section 131 will mainly be described, and the description of similar portions of second claw section 132 will be omitted as required.

Straightening unit 33 clamps lead wire 113 of lead component 110 that is held by chuck 66 with first and second claw sections 131, 132 to straighten lead wire 113. As a result, for example, in the case where lead wire 113 is bent to such an extent that lead wire 113 cannot be inserted into the through hole in circuit substrate 12, straightening unit 33 clamps lead wire 113 so bent with first and second claw sections 131, 132 to reduce the bending of lead wire 113 and straightens the bending of lead wire 113 to such an extent that enables lead wire 113 to be inserted into the through hole. Alternatively, for example, in the case where lead wire 113 cannot be inserted into the through hole in circuit substrate 12 due to a deviation in a positional relationship between component main body section 111 and lead wire 113, straightening unit 33 clamps lead wire 113 with first and second claw sections 131, 132 and straightens the position and direction of lead wire 113 to such an extent that enables lead wire 113 to be inserted into the through hole.

As shown in FIGS. 4 and 5, first claw section 131 is formed into a plate that is bent into an L-shape. Width 140 of first claw section 131 in the X-direction (the lateral direction) is determined in accordance with a diameter of lead wire 113 (for example, 2 to 10 times the diameter of lead wire 113) to such a degree that lead wire 113 bent can be clamped therein. First opening/closing driving section 133 functions as a drive source for moving first claw section 131 to clamp lead wire 113. First opening/closing driving section 133 includes, for example, an air cylinder, and first claw section 131 is connected to an output shaft thereof. First opening/closing driving section 133 can move first claw section 131 in the Y-direction. First opening/closing section 133 advances or retreats first claw section 131 in the Y-direction so that first claw section 131 moves towards second claw section 132 or the first claw section 131 moves away from second claw section 132. Similarly, second opening/closing driving section 134 advances or retreats second claw section 132 in the Y-direction so that second claw section 132 moves towards first claw section 131 or second claw section 132 moves away from first claw section 131.

Figure 6:
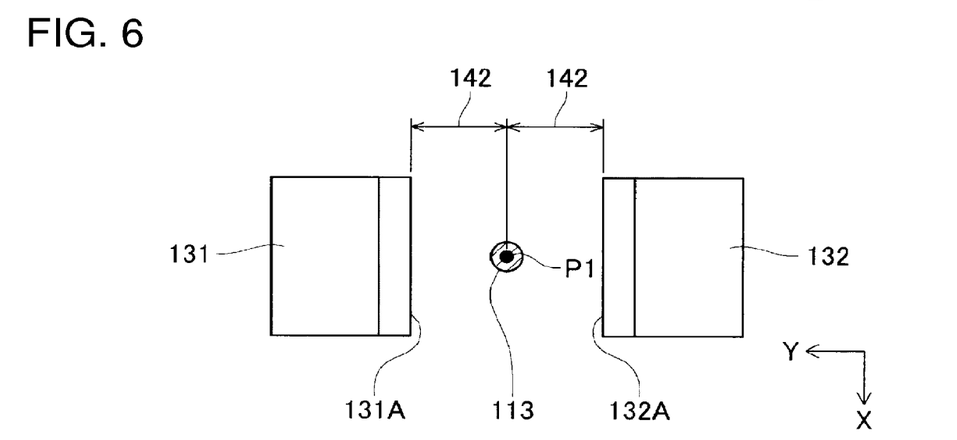
FIG. 6 is a top view of the first claw section and a second claw section as seen from above in a Z-direction.

FIG. 6 shows a state where first and second claw sections 131, 132 are seen from above in the Z-direction. As shown in FIGS. 4 and 6, clamping surfaces 131A, 132A, which constitute surfaces extending along the X-direction and the Z-direction, are formed at portions facing lead wire 113 on first and second claw sections 131, 132, respectively. Therefore, in this embodiment, first and second claw sections 131, 132 clamp lead wire 113 with two clamping surfaces 131A, 132A.

Figure 7:
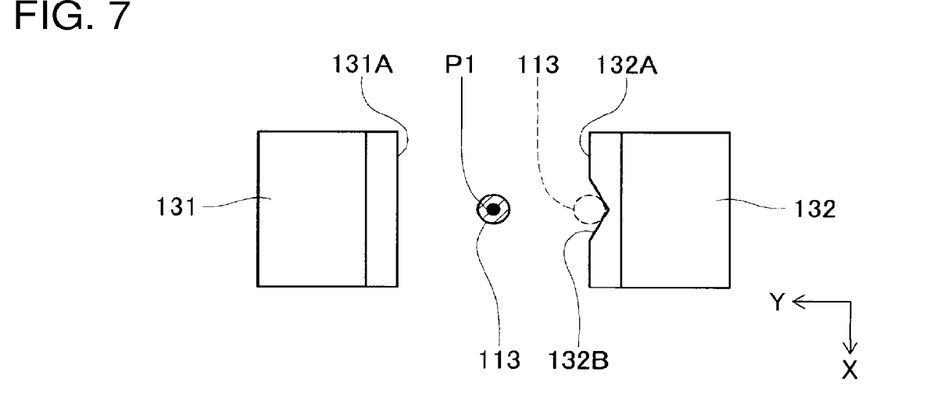
FIG. 7 is a top view of a first and second claw sections of another example as seen from above in the Z-direction.

Clamping surfaces 131A, 132A are not limited to a flat surface. FIG. 7 shows a state where first and second claw sections 131, 132 of another example are seen from above in the Z-direction. As shown in FIG. 7, for example, a groove 132B may be provided on clamping surface 132A of second claw section 132 by providing a recess matching the shape or size of lead wire 113. Groove 132B is formed with a depth or a width in accordance with, for example, the diameter or size of lead wire 113, a movement range of lead wire 113 that deviates due to the bending of lead wire 113, or the like.

First and second opening/closing driving sections 133, 134 are rested on base 135 having a plate-like shape and are fixed to base 135. Support shaft 137 has, for example, a circular cylindrical shape and is connected to base 135 from a lower surface side of base 135. Driving section 139 rotates base 135, that is, first and second claw sections 131, 132 and first and second opening/closing driving sections 133, 134 by rotating support shaft 137. Driving section 139 can detachably be attached, for example, to the slot of component mounter 10 and is fixed a main body section (not shown) of straightening unit 33.

As shown in FIG. 4, driving section 139 rotates base 135 (first and second claw sections 131, 132) around rotation axis 124 extending along the up-down direction (the first direction) that constitutes a direction in which chuck 66 (work heads 60, 62) faces straightening unit 33 when straightening lead wire 113 (refer to arrow 125 in FIG. 4). As a result, positions of first and second claw sections 131, 132 relative to lead wire 113 that held by chuck 66 are changed. Rotation axis 124 around which base 135 is rotated may be an axis extending along a direction that forms a predetermined angle with the up-down direction (the first direction).

As shown in FIG. 8, control device 34 includes controller 190, multiple drive circuits 192, image processing devices 195, 196, and a storage device 197. Multiple drive circuits 192 are connected to the devices described above such as conveyance device 50, clamping device 52, work head moving device 64, opening/closing device 86, driving device 90, tray-type component supply device 97, bulk component supply device 32, first and second opening/closing driving sections 133, 134, driving section 139, and the like.

Controller 190 includes CPU, ROM, RAM, and the like and works mainly on a computer and is connected to multiple driving circuits 192. Controller 190 controls base substrate conveyance and holding device 22, component mounting device 24, and the like, and controls generally operations of component mounter 10. In this embodiment, controller 190 reads in control data D1 saved in storage device 197 and executes work of mounting components on circuit substrate 12. Storage device 197 includes, for example, a hard disk, a memory, and the like. In addition, data such as types of circuit substrates 12 to be produced, types of components to be mounted on circuit substrates 12, mounting positions of such components, and the like are set in control data D1.

Controller 190 is also connected to image processing device 195. Image processing device 195 processes image data imaged by side camera 67 of component supply device 24. Controller 190 detects a bending of lead wire 113 of lead component 110 held by chuck 66, a positional error between the component main body section 111 and lead wire 113, and the like through processing by image processing device 195.

In addition, controller 190 is also connected to image processing device 196. Image processing device 196 processes image data imaged by mark camera 26 and part camera 28. Controller 190 obtains various types of information detected through the processing by image processing device 196. Controller 190 may detect a bending of lead wire 113 or the like based on image data imaged by part camera 28.

(Straightening Operation of Lead Wire 113 and Mounting Operation of Lead Component 110)

Component mounter 10 performs mounting work of mounting components on circuit substrate 12 held by substrate conveyance and holding device 22 using the configuration described above. In addition, component mounter 10 executes a straightening of lead wire 113 of lead component 110 as required in the mounting work. Although component mounter 10 can mount various types of components on circuit substrate 12, the following description will describe a case where lead component 110 is mounted on circuit substrate 12.

Figure 9:
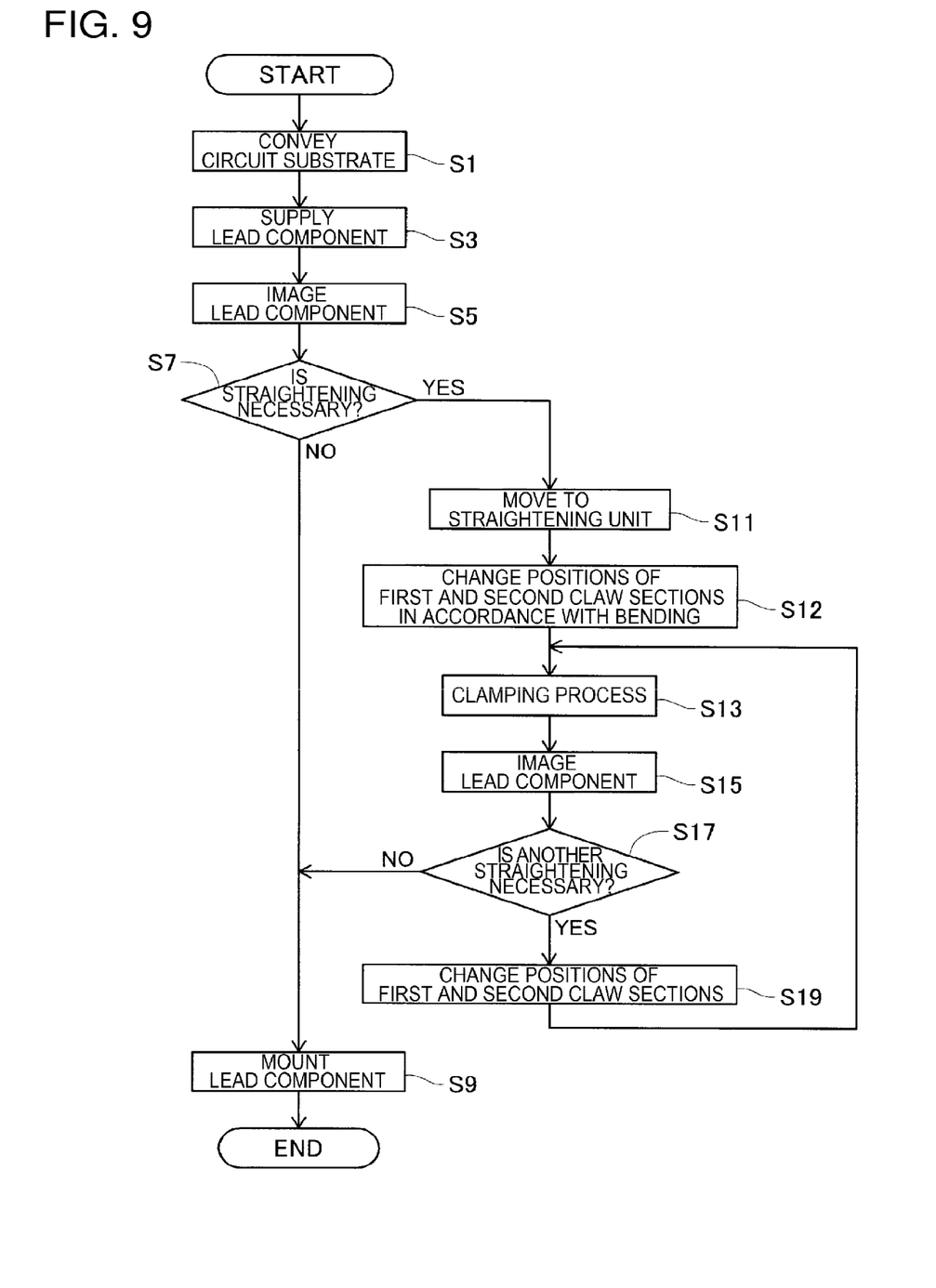
FIG. 9 is a flowchart showing a straightening operation of a lead wire and a mounting operation of a lead component by the component mounter.

FIG. 9 shows a flowchart of a straightening operation of lead wire 113 and a mounting operation of lead component 110 that are performed by component mounter 10 (control device 34). Firstly, in step (hereinafter, referred to simply as "S") 1 in FIG. 9, when circuit substrate 12 is conveyed into component mounter 10 from a device on an upstream side of a production line and is conveyed to a work position of substrate conveyance and holding device 22, circuit substrate 12 is held fixedly by clamping device 52 in the work position. In addition, mark camera 26 moves to a position lying over circuit substrate 12 to image circuit substrate 12. Then, controller 190 calculates information on a holding position of circuit substrate 12 or the like based on image data imaged by mark camera 26.

Next, in S3, component supply device 30 or bulk component supply device 32 supplies lead component 110 in a predetermined supply position. Then, either of work heads 60, 62 is moved to a position lying over the supply position of lead component 110, and component main body section 111 of lead component 110 is held by pair of chuck claws 103 of chuck 66 therebetween, whereby lead component 110 is held in place.

Next, in S5, in work heads 60, 62, lead component 110 clamped by chuck 66 is imaged by side camera 67. Lead component 110 is imaged by side camera 67 while work heads 60, 62 are moving from the component supply position to the work position. Controller 190 calculates information on the holding position of lead component 110 or the like based on image data obtained by side camera 67. In step S7, controller 190 determines whether lead wire 113 needs to be straightened based on the image data obtained by side camera 67.

Controller 190 calculates a degree at which lead wire 113 is bent or a positional deviation between component main body section 111 and lead wire 113 based, for example, on image data of a side of lead component 110 obtained by side camera 67. Controller 190 determines whether lead wire 113 needs to be straightened by determining whether the degree at which lead wire 113 is bent or the degree at which the component main body section 111 deviates from lead wire 113 stays within a range of a preset reference value (S7). This reference value can be set based on a permissible range of bending relative to an original position of lead wire 113 where lead wire 113 can be inserted properly into the through hole in circuit substrate 12. The reference value is set based on, for example, a pitch 141 of lead wires 113 (refer to FIG. 4), a size of the through hole of circuit substrate 12, and the like. The pitch 141 of lead wires 113 ranges, for example, from 5 mm to 15 mm.

Work heads 60, 62 may drive driving device 90 to rotate corresponding chucks 66 in S5 to image lead component 110 from multiple angles by side camera 67. As a result, controller 190 can more accurately determine on the degree of bending of lead wire 113, the necessity of straightening of lead wire 113, and the like based on multiple pieces of image data.

In addition, controller 190 may image lead component 110 clamped by chuck 66 using part camera 28. For example, work heads 60, 62 each holding lead component 110 are moved to the position over part camera 28 after lead component 110 is clamped by chuck 66. Part camera 28 images lead component 110 held by chuck 66 from below. Then, controller 190 may calculate information on the holding position of lead component 110, the bending of lead wire 113, and the like based on image data obtained by part camera 28. In addition, component mounter 10 may include only either of side camera 67 and part camera 28. Component mounter 10 may include a fixed camera (a line camera or the like) on frame section 40 to image lead component 110 clamped by chuck 66 from a side thereof.

When determining that lead wire 113 does not have to be straightened in step S7 (S7: NO), controller 190 moves work heads 60, 62 that are holding corresponding lead components 110 to a position lying over circuit substrate 12 (S9). Controller 190 controls work heads 60, 62 while they are being moved to correct an error of the holding position of lead component 110 or the like. Work heads 60, 62 drive driving device 90 to correct an error of holding position of lead component 110 held by chuck 66. When moving to reach the position lying over circuit substrate 12, work heads 60, 62 drive driving device 90 to lower corresponding chucks 66. Then, pair of lead wires 113 of lead component 110 held by each of chucks 66 are inserted into the two through holes formed in circuit substrate 12.

On the other hand, when determining in S7 that lead wire 113 needs to be straightened (S7: YES), controller 190 moves work heads 60, 62 each holding lead component 110 to a position lying over straightening unit 33 (S11). Consequently, in this embodiment, controller 190 determines whether lead wire 113 needs to be straightened based on image data of lead wire 113 in question imaged by side camera 67 (an imaging section) (S7). Then, when determining that lead wire 113 in question needs to be straightened (S7: YES), controller 190 clamps and straightens lead wire 113 in question by straightening unit 33 (first and second claw sections 131, 132).

As described above, when determining that lead wire 113 needs to be straightened based on the image data obtained by side camera 67, controller 190 (control device 34) of this embodiment clamps and straightens lead wire 113 that is so determined using first and second claw sections 131, 132. As a result, since controller 190 executes a straightening of lead wire 113 only in a case where controller 190 determines on a straightening of lead wire 113 by referring to a predetermined reference value or the like, unnecessary clamping process can be eliminated to improve the work efficiency. Since controller 190 can start mounting lead component 110 that requires no clamping on circuit substrate 12 without clamping lead component 110 in question with straightening unit 33, the production efficiency of circuit substrates 12 can be improved.

Figure 10:
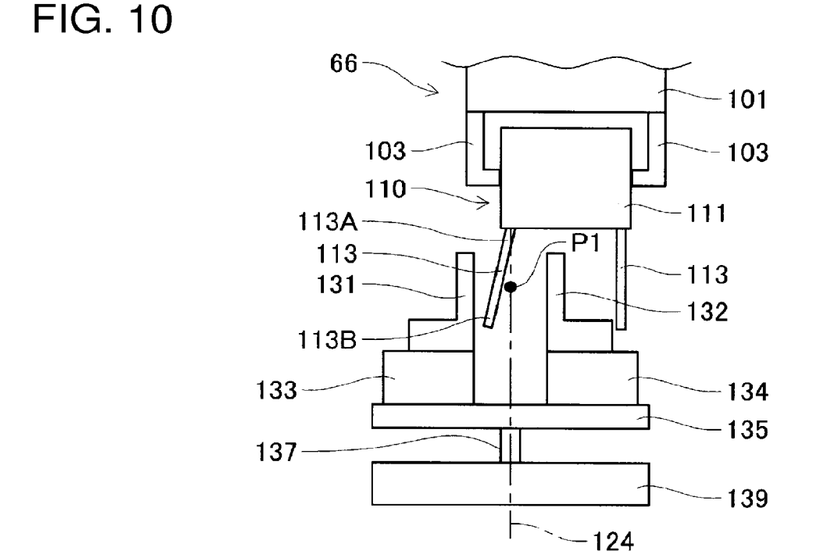
FIG. 10 is a schematic diagram showing an arrangement of a bent lead wire and the straightening unit when the bent lead wire is clamped by the straightening unit.

FIG. 10 schematically shows an arrangement of bent lead wire 113 and straightening unit 33 when bent lead wire 113 is clamped by straightening unit 33. In S11, as shown in FIG. 10, controller 190 disposes lead wire 113 of lead component 110 held by chuck 66 between first and second claw sections 131, 132 of straightening unit 33.

At this time, first and second claw sections 131, 132 are disposed in such a manner as to clamp lead wire 113 in clamping position P1. In other words, controller 190 moves work heads 60, 62 (chucks 66) to a predetermined position on straightening unit 33 so as to clamp lead wire 113 in clamping position P1.

As shown in FIG. 4, clamping position P1 constitutes a position interposed between first and second claw sections 131, 132 on an axis extending along a direction (the up-down direction) in which lead wire 113 requiring no straightening (free from bend), for example, lead wire 113 extending downwards into a straight line from component main body section 111 extends. Controller 190 sets clamping position P1 in accordance with, for example, a type of lead component 110, pitch 141 of lead wire 113, a lengths of lead wire 113, and the like that are set in control data D1 (refer to FIG. 8) for production and disposes lead wire 113 between first and second claw sections 131, 132. In addition, as shown in FIG. 6, first and second claw sections 131, 132 are disposed in positions that face each other in the Y-direction with lead wire 113 held therebetween. For example, as shown in FIG. 6, first and second claw sections 131, 132 are disposed in positions that lie by same distance 142 away from clamping position P1 along the Y-direction. In other words, first and second claw sections 131, 132 are disposed in a face-to-face fashion in the positions that lie by same distance 142 away from clamping position P1 with clamping position P1 clamped therebetween.

In addition, controller 190 controls a position to which chuck 66 is lowered based on information set in control data D1 such as a size of component main body section 111, a length of lead wire 113, and the like. As a result, a length (a depth) over which lead wire 113 is inserted between first and second claw sections 131, 132 is controlled.

Figure 11:
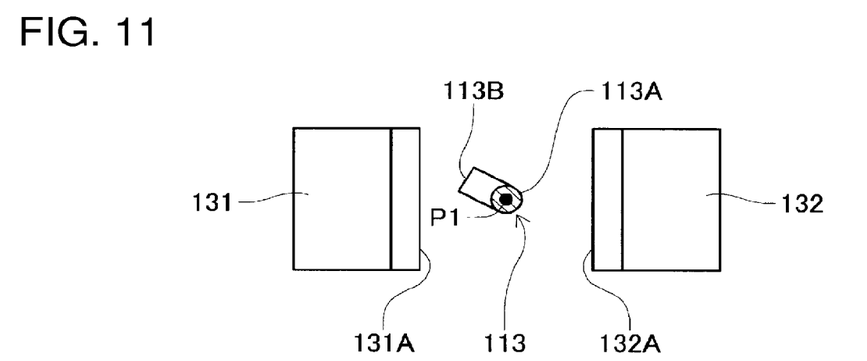
FIG. 11 is a top view of the first and second pawl sections, showing a state resulting before the first and second claw sections are rotate in a direction matching a direction in which the lead wire is bent.
Figure 12:
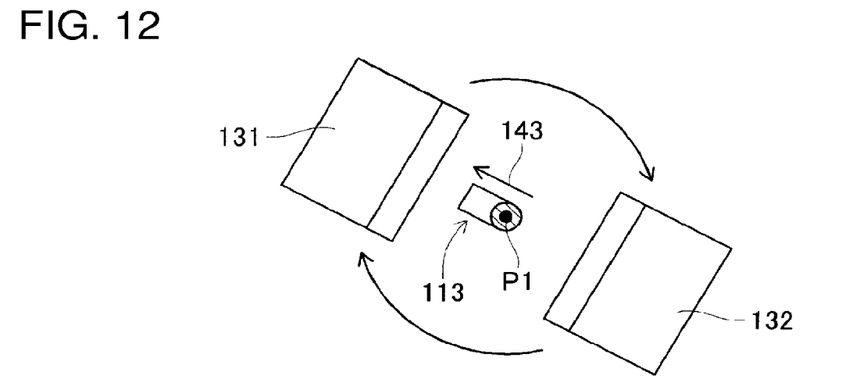
FIG. 12 is a top view of the first and second pawl sections, showing a state resulting after the first and second claw sections are rotated in the direction matching the direction in which the lead wire is bent.

Next, in S12 in FIG. 9, controller 190 (control device 34) causes driving section 139 to rotate first and second claw sections 131, 132 to change the positions of first and second claw sections 131, 132 relative to lead wire 113 in accordance with a direction in which lead wire 113 is bent before controller 190 clamps lead wire 113 to straighten it. Controller 190 detects a direction in which lead wire 113 is bent based, for example, on image data imaged by side camera 67 in S5 described above. FIGS. 11 and 12 are top views of first and second claw sections 131, 132, showing a state where first and second claw sections 131, 132 are rotated in accordance with a direction in which lead wire 113 is bent.

A direction in which lead wire 113 is bent in FIGS. 11 and 12 corresponds to a direction in which lead wire 113 is bent in FIG. 10. As shown in FIG. 10, lead wire 113 bends to the left in the figure as it extends from a proximal end section 113A facing component main body section 111 towards distal end portion 113B. Due to this, pitch 141 (refer to FIG. 4), which constitutes a distance between pair of lead wires 113, becomes longer at distal end portion 113B. In addition, when lead wire 113 is seen from above as shown in FIGS. 11 and 12, lead wire 113 bends upwards to the left in the figures (refer to arrow 143 in FIG. 12).

Here, in the case where lead wire 113 that bends or deviates from a proper position is straightened to a desired original position, for example, lead wire 113 is preferably clamped by first and second claw sections 131, 132 from the direction or orientation in which lead wire 113 deviates from its original position due to bending or the like. More specifically, as compared with a case where lead wire 113 is clamped by first and second claw sections 131, 132 that lie in their initial positions as shown in FIG. 11, lead wire 113 can be straightened effectively by disposing first and second claw sections 131, 132 on both sides of the direction (arrow 143) in which lead wire 113 bends to clamp lead wire 113 therebetween as shown in FIG. 12. For example, in the case where first and second claw sections 131, 132 positioned as shown in FIG. 12 are disposed in positions that result from rotating first and second claw sections 131, 132 90 degrees around rotation axis 124 (refer to FIG. 10), lead wire 113 is clamped from a direction in which lead wire 113 does not bend, whereby the straightening effect is reduced.

Then, controller 190 of this embodiment rotates first and second claw sections 131, 132 from the initial positions shown in FIG. 11 to the positions shown in FIG. 12 in S12 before a subsequent clamping operation is started in S13 to thereby change the positions of first and second claw sections 131, 132 relative to lead wire 113 in accordance with the direction in which lead wire 113 bends. As a result, lead wire 113 is clamped by first and second claw sections 131, 132 from the direction (arrow 143) in which lead wire 113 bends, whereby the bending of lead wire 113 can be straightened with good efficiency. Controller 190 may change the rotational positions of first and second claw sections 131, 132 relative to lead wire 113 by driving device 90 to rotate chuck 66, that is, to rotate lead component 110. Alternatively, controller 190 may rotate both straightening unit 33 and chuck 66.

Figure 13:
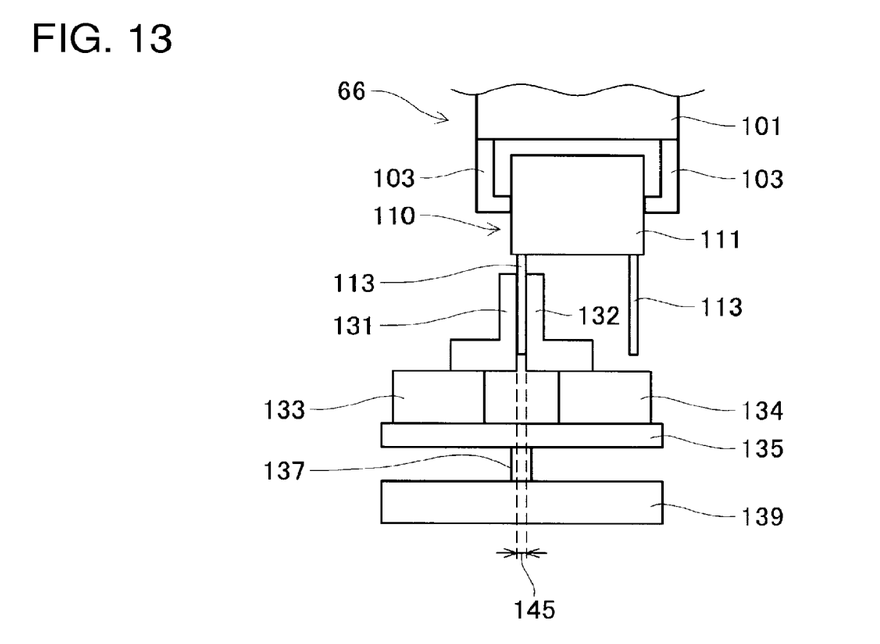
FIG. 13 is a diagram showing a state where the lead wire is clamped by the first and second claw sections.

Next, controller 190 clamps lead wire 113 with first and second claw sections 131, 132 (S13). Controller 190 causes straightening unit 33 to clamp lead wire 113 with first and second claw sections 131, 132 after controller 190 has changed the positions of first and second claw sections 131, 132. As shown in FIG. 13, first and second claw sections 131, 132 slide towards each other to clamp lead wire 113 therebetween.

In this embodiment, first and second claw sections 131, 132 clamp lead wire 113 with a gap corresponding to clamping distance 145 defined therebetween. Clamping distance 145 is a distance defined between first and second claw sections 131, 132 in a sliding direction (a second direction) when first and second claw sections 131, 132 clamp lead wire 113 therebetween. Controller 190 can control clamping distance 145 by controlling first and second opening/closing driving sections 133, 134. Then, in the clamping process in S13, controller 190 controls clamping distance 145 in accordance with the diameter of lead wire 113.

Specifically, controller 190 controls first and second opening/closing driving sections 133, 134 so as to ensure a length corresponding to a value of the diameter of lead wire 113 that is set in control data D1 for clamping distance 145. As a result, for example, the bending of lead wire 113 can be straightened while preventing an occurrence of such a drawback that lead wire 113 is collapsed by first and second claw sections 131, 132 by providing a gap corresponding to the diameter of lead wire 113.

Figure 14:
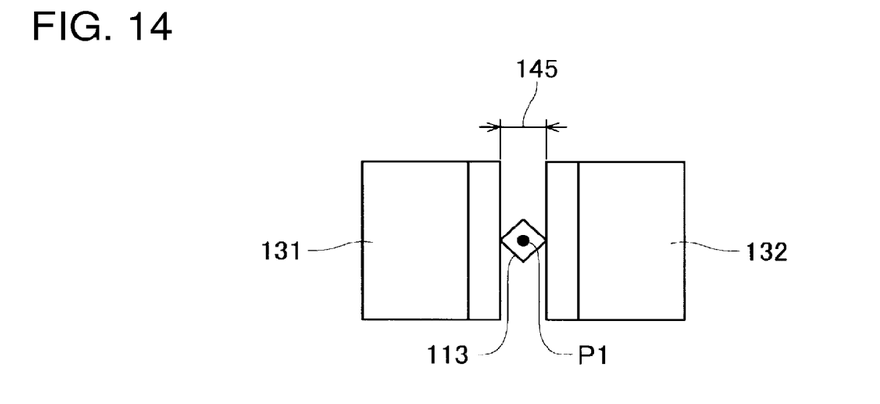
FIG. 14 is a top view showing a state where a quadrangular prism-like lead wire is clamped by the first and second claw sections therebetween.

In the case where lead wire 113 has a circular cylindrical shape, controller 190 can control clamping distance 145 in accordance with a value of a diameter of lead wire 113. In the case where lead wire 113 has a quadrangular prism-like shape, controller 190 can set clamping distance 145 in accordance with a positional relationship between lead wire 113 and first and second claw sections 131, 132. For example, FIG. 14 shows a top view of a state where lead wire 113 having a quadrangular prism-like shape is clamped by first and second claw sections 131, 132. As shown in FIG. 14, first and second claw sections 131, 132 clamp lead wire 113 in such a manner as to clamp two vertices of a square cross section from both sides. In this case, controller 190 can set a length of a diagonal line of lead wire 113 as clamping distance 145. That is, controller 190 may calculate and set optimum clamping distance 145 that prevents lead wire 113 from being collapsed in accordance with an external shape or a cross-sectional shape of lead wire 113 or rotational positions of first and second claw sections 131, 132.

Controller 190 causes first and second claw sections 131, 132 to move away from each other to keep an open space defined therebetween after lead wire 113 is clamped by first and second claw sections 131, 132 therebetween in S13. Next, in S15, controller 190 causes side cameras 67 of work heads 60, 62 to image corresponding lead components 110 clamped by chucks 66 again. In each of work heads 60, 62, lead component 110 may be imaged by side camera 67 with lead wire 113 kept inserted between first and second claw sections 131, 132. In each of work heads 60, 62, lead component 110 may be imaged from multiple angles by driving device 90 to rotate chuck 66. In addition, in each of work heads 60, 62, lead component 110 may be imaged in such a state that work head is lifted up temporarily after first and second claw sections 131, 132 are opened, allowing lead wire 113 to be drawn out of the gap defined between first and second claw sections 131, 132. Further, controller 190 may have lead component 110 imaged by part camera 28 in S15.

Controller 190 determines based on image data obtained by side camera 67 whether lead wire 113 needs to be straightened again (S17). That is, controller 190 determines whether the degree of bending of lead wire 113 or the positional deviation thereof has been straightened to fall within the range of the preset reference value by the clamping process in S13. When determining that lead wire 113 does not have to be straightened again (S17: NO), controller 190 moves work heads 60, 62 each holding lead component 110 to lie over circuit substrate 12 and performs mounting work (S9).

Figure 15:
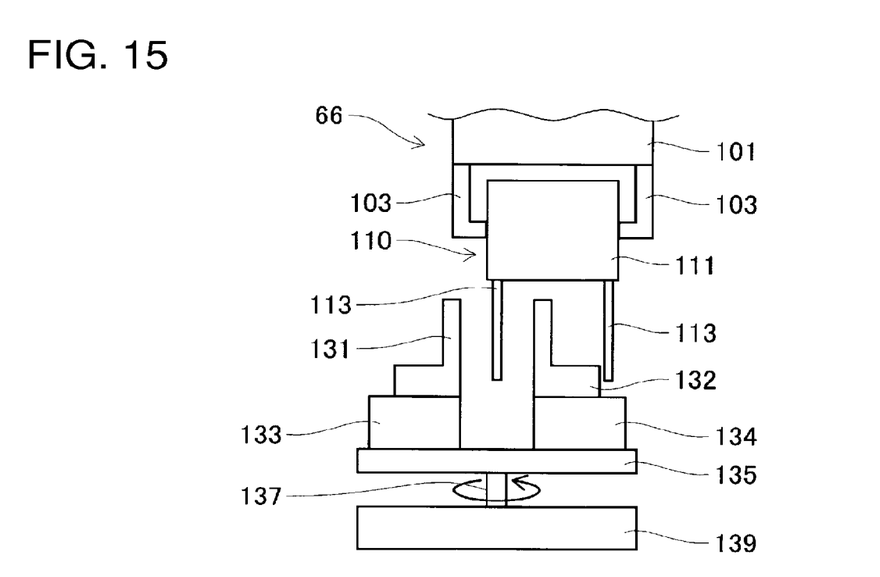
FIG. 15 is a diagram showing a state where the first and second claw sections are opened after they clamp the lead wire to rotate the straightening unit.

On the other hand, when determining that lead wire 113 needs to be straightened again (S 17: YES), controller 190 causes driving section 139 to rotate straightening unit 33 to thereby change the positions of first and second claw sections 131, 132 relative to lead wire 113 (S 19). As shown in FIG. 15, for example, after causing first and second claw sections 131, 132 to be kept opened, controller 190 causes driving section 139 to rotate base 135 by a predetermined angle, which is preset, around support shaft 137 (rotation axis 124).

Figure 16:
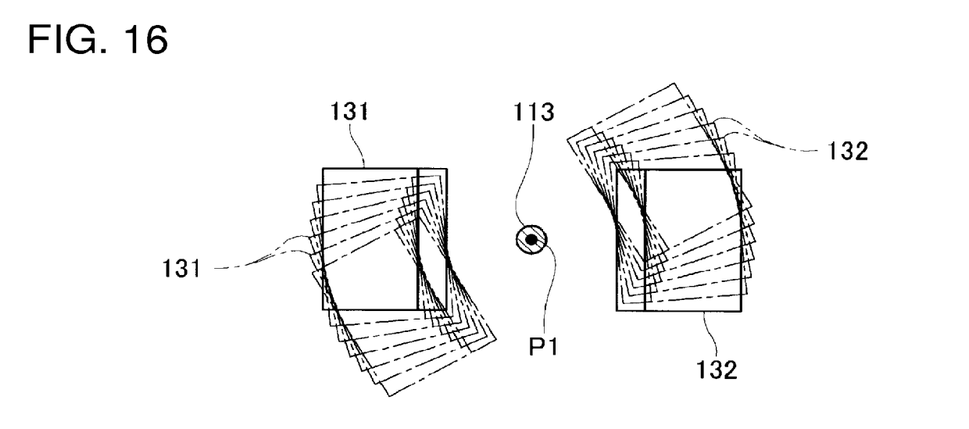
FIG. 16 is a diagram showing a state where the first and second claw sections are rotated subsequently by a predetermined angle.

The predetermined angle, which is preset, is set in accordance with, for example, the diameter of lead wire 113. FIG. 16 shows positions where first and second claw sections 131, 132 are rotated sequentially by a predetermined angle. Every time the process of S19 is performed, first and second claw sections 131, 132 are rotated counterclockwise by the predetermined angle as indicted by alternate long and short dash lines in FIG. 16. As a result, the rotational positions of first and second claw sections 131, 132 relative to lead wire 113 are changed.

Here, a case is studied where the rotational positions of first and second claw sections 131, 132 relative to lead wire 113 are changed by rotating chuck 66. In a state shown in FIG. 15, when chuck 66 is rotated, lead component 110 rotates around a rotation axis 121 (refer to FIG. 4) that passes through a center of component main body section 111. In this case, not only the rotational positions of first and second claw sections 131, 132 relative to lead wire 113 but also relative positions of first and second claw sections 131, 132 relative to lead wire 113 (the positions of first and second claw sections 131, 132 in the X-direction and the Y-direction) are caused to deviate. Due to this, controller 190 needs to dispose lead wire 113 in clamping position P1 (refer to FIG. 4) by not only rotating chuck 66 but also changing the position of work head 60 or 62. That is, not only the rotating operation but also the positional adjustment in the X-direction and the Y-direction are necessary.

On the other hand, in this embodiment, driving section 139 can rotate straightening unit 33 (first and second claw sections 131, 132) based on the control performed by controller 190. Controller 190 changes the positions of first and second claw sections 131, 132 relative to lead wire 113 by rotating first and second claw section s 131, 132. As a result, the positional control of first and second claw sections 131, 132 relative to lead wire 113 can be executed only by rotating straightening unit 33. In addition, the position of chuck 66 can be fixed, whereby a positional deviation of lead component 110 relative to chuck 66 can be prevented.

For example, controller 190 may rotate first and second claw sections 131, 132 in accordance with the direction in which lead wire 113 bends as in S12 without rotating first and second claw sections 131, 132 by the predetermined angle, which is preset, in S19. In addition, controller 190 may change the rotational positions of first and second claw sections 131, 132 relative to lead wire 113 by rotating chuck 66 to rotate, in turn, lead component 110 without rotating first and second claw sections 131, 132. Alternatively, controller 190 may rotate both straightening unit 33 and chuck 66.

Next, after having changed the rotational positions of first and second claw sections 131, 132 in S19, controller 190 executes again the processes from S13 on. That is, in this embodiment, controller 190 changes the positions of first and second claw sections 131, 132 every time it performs the clamping process and then performs the clamping process (S13) again. As a result, lead wire 113 can be straightened into a desired state by clamping lead wire 113 multiple times while changing the positions of first and second claw sections 131, 132.

Then, when another straightening is required no more (S17: NO), controller 190 has lead component 110 mounted on circuit substrate 12 (S9). As a result, even in a case where lead wire 113 is found to bend at a point in time when lead wire 113 is supplied from component supply device 30 or the like to be clamped by chuck 66, lead wire 113 in question can be straightened by straightening unit 33, whereby lead component 110 can be mounted on circuit substrate 12.

Controller 190 does not have to make a determination on whether straightening is performed properly (S17) every time one clamping process (S13) is carried out. For example, controller 190 may make a determination on whether straightening is performed properly after the clamping process (S13) and the position change of first and second claw sections 131,132 (S19) are performed repeatedly multiple times (S17). Alternatively, controller 190 may change the positions of first and second claw sections 131, 132 (S19) after the clamping process (S13) is performed multiple times by first and second claw sections 131, 132 that are disposed in the same positions. Also, when lead wire 113 cannot be straightened properly even after lead wire 113 is clamped for straightening multiple times, controller 190 may discard lead component 110 in question.

Chuck 66 constitutes an example of a holding section. Driving device 90 and driving section 139 constitute an example of a driving section. Side camera 67 and part camera 28 constitute an example of an imaging section.

Thus, the present embodiment that has been described heretofore provides the following working effects.

Control device 34 causes driving section 139 and driving device to rotate both chuck 66 (the holding section) and straightening unit 33 around rotation axes 121, 124 that extend in the up-down direction (the first direction), respectively. After lead wire 113 is once clamped to be straightened by first and second claw sections 131, 132 (S13 in FIG. 9), control device 34 rotates straightening unit 33 or the like to thereby change the positions of first and second claw sections 131, 132 relative to lead wire 113 (S19). Then, after the positions of first and second claw sections 131, 132 relative to lead wire 113 are changed, control device 34 clamps lead wire 113 in question again for straightening (S13). As a result, the bending of lead wire 113 or the deviation in positional relationship between component main body section 111 of lead component 110 and lead wire 113 can be reformed by changing the relative positions (rotational positions) of first and second claw sections 131, 132 relative to lead wire 113 and clamping lead wire 113 from the different directions. Therefore, according to this configuration, straightening unit 33 does not have to be advanced (moved upwards in the Z-direction) and retreated (moved downwards in the Z-direction) relative to lead component 110, although the straightening unit is advanced and retreated in that way in the related art (Japanese Patent Laid-Open No. 62-220233). As a result, a reduction in size of straightening unit 33 and hence component mounter 10 can be realized.

In addition, in the related art (Japanese Patent Laid-Open No. 62-220233), the straightening unit is retreated with the lead wire kept clamped with the pair straightening claws. Due to this, since the lead wire is stretched during the straightening operation, there are fears that the lead wire is broken. In contrast with this, according to component mounter 10 of this embodiment, since lead wire 113 does not have to be stretched in the straightening operation, lead wire 113 can be prevented from being broken.

Further, in a device such as bulk component supply device 32 of this embodiment for supplying lead components 110 that are scattered at random, lead wire 113 tends to be bent easily when compared with a case where lead components 110 that are aligned in advance are supplied as from tray-type component supply device 97. Due to this, it is extremely effective to use straightening unit 33 of this embodiment for lead components 110 that are supplied from bulk component supply device 32.

This patent application is not limited to the embodiment that has been described heretofore and hence can be carried out in various forms that are modified or improved based on the knowledge of those skilled in the art to which the present disclosure pertains.

Figure 17:
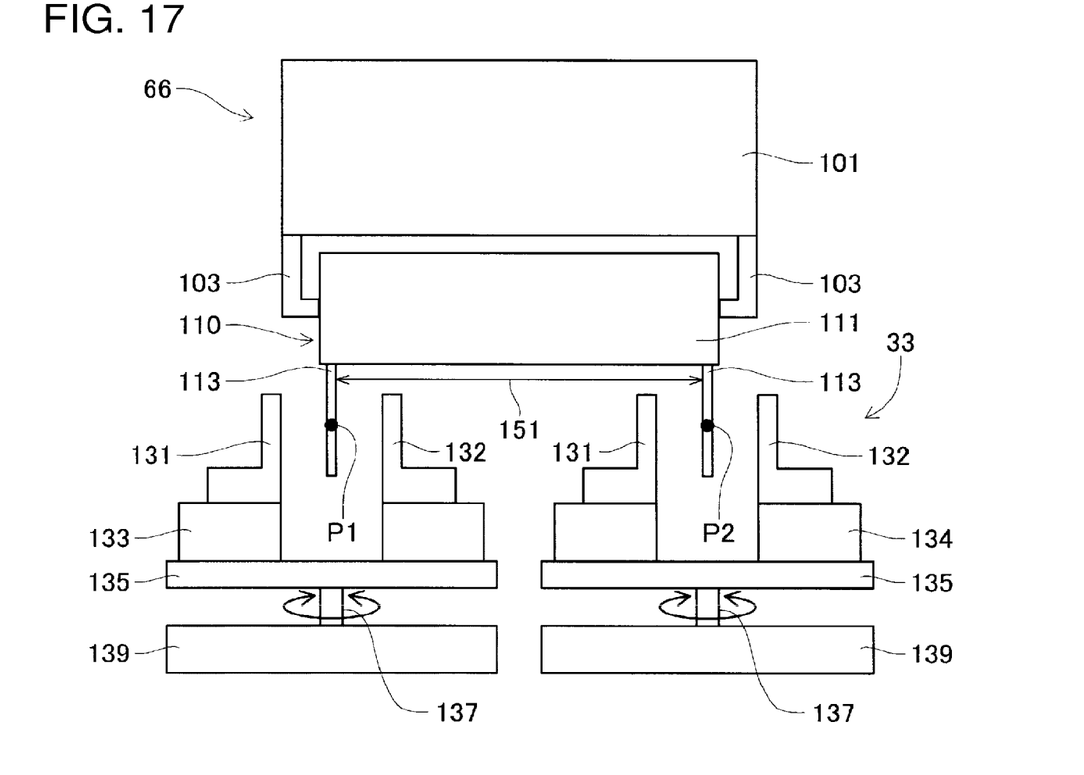
FIG. 17 is a schematic diagram showing a case where two straightening units of another example are used.

For example, while straightening unit 33 is described as including the set of first and second claw sections 131, 132 in the embodiment described above, straightening unit 33 may include multiple sets of first and second claw sections 131, 132. FIG. 17 shows a configuration in which two sets of first and second claw sections 131, 132 are provided.

As shown in FIG. 17, two sets of first and second claw sections 131, 132 clamp corresponding lead wires 113 in clamping positions P1, P2 where lead wires 113 are clamped. Then, inter-clamping position distance 151, which constitutes a distance between clamping position P1 of a first set of first and second claw sections 131, 132 and clamping position P2 of a second set of first and second claw sections 131, 132 is made the same as a distance corresponding to a pitch between two lead wires 113, for example, a pitch between two lead wires 113.

According to this configuration, two lead wires 113 can be straightened altogether by use of two sets of first and second claw sections 131, 132. In addition, since the inter-clamping position distance 151 between two sets of first and second claw sections 131, 132 is set the same as the pitch between lead wires 113, each of two sets of first and second claw sections 131, 132 clamps lead wire 113 in the positions that are spaced a distance corresponding to the pitch away from each other (clamping positions P1, P2). As a result, not only lead wires 113 can individually be straightened, but also the pitch between lead wires 113 can be straightened, whereby lead wires 113 can be straightened into an appropriate position or orientation.

Inter-clamping position distance 151 is not limited to the distance that is the same as the pitch and hence may be a distance that is slightly longer or shorter than the pitch. Straightening unit 33 may include three or more multiple sets of first and second claw sections 131, 132. In this case, too, inter-clamping position distance 151 between multiple sets of first and second claw sections 131, 132 may be a distance determined in accordance with a pitch of such first and second claw sections 131, 132.

In the embodiment described above, while first and second claw sections 131, 132 are both made to slide, the position of either of first and second claw sections 131, 132 may be fixed.

In addition, while straightening unit 33 is described as including the two claw sections (first and second claw sections 131, 132) as the claw sections for clamping one lead wire 113, straightening unit 33 may include three or more claw sections.

While straightening unit 33 is described as causing first and second claw sections 131, 132 to slide to clamp lead wire 113 therebetween, the present disclosure is not limited to this configuration. For example, straightening unit 33 may include first and second claw sections 131, 132 that are caused to intersect each other as in a pair of scissors or pincers, so that first and second claw sections 131, 132 are rotated around a point of intersection to clamp lead wire 113 therebetween.

In addition, the lead wire straightening device of this patent application may not include substrate conveyance and holding device 22 for conveying circuit substrate 12, component supply device 30, bulk component supply device 32, or the like for supplying components, and the like. That is, the lead wire straightening device only needs to include chuck 66 (the holding section), straightening unit 33, driving section 139, and control device 34.

In the embodiment described above, while the relative positions of first and second claw sections 131, 132 to lead wire 113 are changed by rotating straightening unit 33 and chuck 66, the present disclosure is not limited to this configuration. For example, the relative positions of first and second claw sections 131, 132 to lead wire 113 may be changed by rotating wholly work heads 60, 62. In this case, work heads 60, 62 constitute an example of the holding section of the subject patent application.

The gap corresponding to clamping distance 145 does not have to be defined between first and second claw sections 131, 132 when lead wire 113 is clamped therebetween.

In addition, controller 190 may straighten lead wires 113 uniformly without imaging lead components by side camera 67 or the like and determining based on image data whether straightening is necessary.

Component mounter 10 may include either of side camera 67 and part camera 28.

REFERENCE SIGNS LIST 10 component mounter (lead wire straightening device); 33 straightening unit; 34 control device; 66 chuck (holding section); 90 driving device (driving section); 110 lead component; 113 lead wire; 121, 124 rotation axis; 131 first claw section; 132 second claw section; 139 driving section; 133 first opening/closing driving section; 134 second opening/closing driving section; 141 pitch; 145 clamping distance; 151 inter-clamping position distance; P1, P2 clamp position.

The invention claimed is:

1. A lead wire straightening device comprising:
a holding section configured to hold a lead component;
a straightening unit configured to straighten a lead wire that the lead component includes;
a driving section configured to rotate at least one of the holding section and the straightening unit around a rotation axis extending in a first direction, the holding section and the straightening unit facing each other along the direction of which when straightening the lead wire; and
a control device,
wherein the straightening unit further comprises:
a first claw section;
a second claw section disposed in a position facing the first claw section in a second direction intersecting the first direction; and
an opening/closing driving section configured to move the first claw section towards or away from the second claw section, and
wherein the control device performs:
a process of disposing the lead wire of the lead component held by the holding section between the first claw section and the second claw section;
a process of straightening the lead wire by controlling the opening/closing driving section of the straightening unit such that the first claw section and the second claw section clamp the lead wire there between;
a process of changing positions of the first claw section and the second claw section relatively to the lead wire by controlling the driving section, after the lead wire is clamped, such that at least one of the holding section and the straightening unit rotate; and
a process of clamping again the lead wire with the first claw section and the second claw section to thereby straighten the lead wire after the positions of the first claw section and the second claw section are changed.

2. The lead wire straightening device according to claim 1,
wherein the control device is configured to control a clamping distance by controlling the opening/closing driving section, the distance of which being defined by the distance between the first claw section and the second claw section in the second direction when clamping the lead wire, and
wherein the clamping distance is controlled in accordance with a diameter of the lead wire through a process of clamping the lead wire with the first claw section and the second claw section to straighten the lead wire, and a process of clamping the lead wire again to straighten the lead wire.

3. The lead wire straightening device according to claim 1, comprising:
an imaging section configured to image the lead wire, wherein the control device determines based on image data of the lead wire imaged by the imaging section whether the lead wire needs to be straightened, and when the control device determines that the lead wire needs to be straightened, the control device causes the first claw section and the second claw section to clamp the lead wire to straighten the lead wire.

4. The lead wire straightening device according to claim 3, wherein the control device detects a direction in which the lead wire bends based on image data of the lead wire imaged by the imaging section, rotates at least one of the holding section and the straightening unit by controlling the driving section before the lead wire is clamped by the first claw section and the second claw section to be straightened thereby, and changes positions of the first claw section and the second claw section relative to the lead wire in accordance with a direction in which the lead wire bends.

5. The lead wire straightening device according to claim 1, wherein the driving section is configured to rotate the straightening unit.

6. The lead wire straightening device according to claim 1, wherein the lead component comprises multiple the lead wires, wherein multiple sets of the first claw section and the second claw section are provided, wherein each set of the multiple sets of the first claw section and the second claw section clamps the corresponding lead wire at the clamping position thereof, and wherein a distance corresponding to a pitch among the multiple the lead wires is set as an inter-clamping position distance that is a distance between the clamping position of a first set of the first claw section and the second claw section and the clamping position of a second set of the first claw section and the second claw section, the first set and the second set being of the multiple sets of the first claw section and the second claw section.

* * * * *